United States Patent
Uchiyama et al.

[11] Patent Number: 5,847,796
[45] Date of Patent: Dec. 8, 1998

[54] LIQUID CRYSTAL DEVICE WITH DRIVER ELEMENT THICKER THAN A FIRST SUBSTRATE AND ON A SECOND SUBSTRATE AND METHOD OF MANUFACTURING

[75] Inventors: Kenji Uchiyama; Kougo Endou, both of Suwa, Japan

[73] Assignee: Seiko Epson Corporation, Tokyo, Japan

[21] Appl. No.: 812,782

[22] Filed: Mar. 6, 1997

[30] Foreign Application Priority Data

Mar. 6, 1996 [JP] Japan .................................... 8-049018
Nov. 26, 1996 [JP] Japan .................................... 8-314594

[51] Int. Cl.⁶ ............................ G02F 1/1345; G02F 1/13
[52] U.S. Cl. ......................... 349/151; 349/149; 349/187
[58] Field of Search ................................. 349/149, 151, 349/152, 187

[56] References Cited

U.S. PATENT DOCUMENTS

| | | | |
|---|---|---|---|
| 4,008,564 | 2/1977 | Luce et al. ................................. | 349/151 |
| 4,145,120 | 3/1979 | Kubota ..................................... | 349/151 |
| 4,643,526 | 2/1987 | Watanabe et al. ........................ | 349/151 |
| 4,826,297 | 5/1989 | Kubo et al. ............................... | 349/151 |
| 5,606,440 | 2/1997 | Kawaguchi et al. ..................... | 349/152 |
| 5,726,726 | 3/1998 | Nakanishi ................................ | 349/149 |
| 5,748,267 | 5/1998 | Natori et al. ............................. | 349/151 |

FOREIGN PATENT DOCUMENTS

| | | |
|---|---|---|
| A-4-34418 | 2/1992 | Japan . |
| 4-319918 | 10/1992 | Japan . |
| A-5-83730 | 4/1993 | Japan . |
| 8-262487 | 10/1996 | Japan . |

*Primary Examiner*—Anita Pellman Gross
*Assistant Examiner*—Tarifur R. Chowdhury
*Attorney, Agent, or Firm*—Oliff & Berridge, PLC

[57] ABSTRACT

A driving IC is face-down bonded to a substrate. The thickness T of the driving IC is greater than the thickness t of an opposing substrate of a liquid crystal panel and an upper surface of the driving IC is made higher than an upper surface of the opposing substrate. The upper surface of the driving IC is heated and pressed by a bonding tool to bond bumps of the driving IC to interconnecting lines and bond the driving IC to the substrate with an adhesive. It is thus possible to sufficiently heat and press the driving IC without contact between the bonding tool and the opposing substrate, thereby permitting bonding with high reliability.

29 Claims, 9 Drawing Sheets

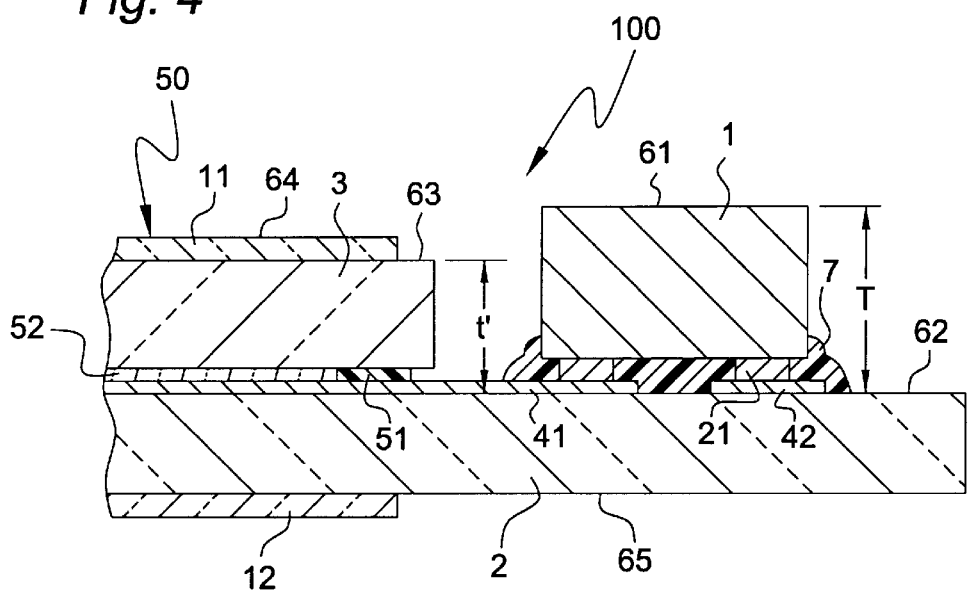
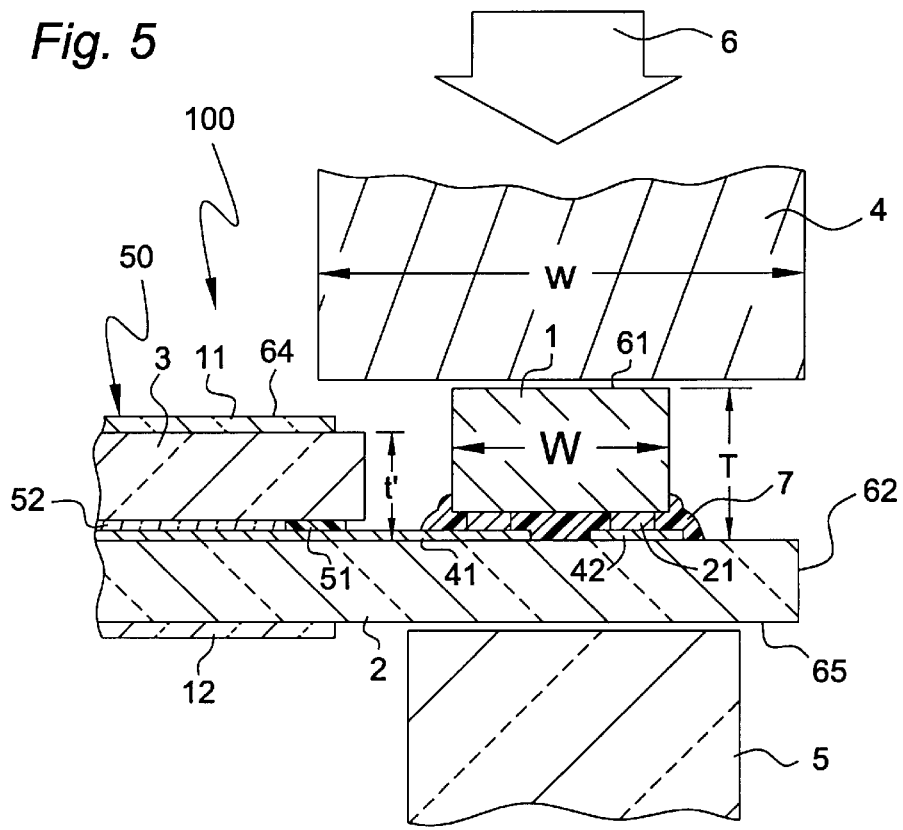

LIQUID CRYSTAL DEVICE WITH DRIVER ELEMENT THICKER THAN A FIRST SUBSTRATE AND ON A SECOND SUBSTRATE AND METHOD OF MANUFACTURING

BACKGROUND OF THE INVENTION

1. Field of the Invention

The present invention relates to a liquid crystal device, a method of manufacturing the same, and an electronic apparatus. More particularly, the present invention is directed to a liquid crystal device comprising a semiconductor COG chip (hereinafter referred to as "driving IC" which is a chip mounted on glass) on a liquid crystal panel for driving a liquid crystal, a method of manufacturing the same and an electronic apparatus comprising the liquid crystal device provided as a display device.

2. Description of Related Art

In recent years, liquid crystal devices have been increasingly manufactured so as to have a COG structure in which a driving IC is mounted on a panel having higher definition and higher density.

Such a COG structure is described in, for example, Japanese Unexamined Patent Publication No. 4-319918. A conventional liquid crystal device having this COG structure will be described with reference to prior art FIG. 14. A conventional liquid crystal device 300 comprises a liquid crystal panel 350 having a substrate 31, a opposing substrate 36 and a liquid crystal material 352 held between both substrates, and a driving IC 32. The driving IC 32 is connected to the substrate 31 by interconnecting lines 341 and 342 and bumps 33 to form the COG structure. The driving IC 32 is protected by a sealing resin 35.

In this conventional liquid crystal device, the sealing resin 35 is higher than the upper surface 361 of the opposing substrate 36, but the upper surface 321 of the driving IC 32 is not higher than the upper surface 361 of the opposing substrate 36.

When the driving IC 32 is bonded, the upper surface 321 of the driving IC 32 must be pressed by a bonding tool 304 before the sealing resin 35 is provided. However, if the driving IC 32 is close to the opposing substrate 3 and since the bonding tool 304 is generally larger than the driving IC 32, the bonding tool 304 contacts the opposing substrate 36 or contacts the edge of the opposing substrate 36. As a result, the driving IC 32 cannot be sufficiently pressed, and the bumps 33 are not sufficiently connected to the interconnecting lines 341 and 342, thereby causing a potential problem of deteriorating reliability.

In order to prevent the bonding tool 304 from contacting the opposing substrate 36 or contacting the edge of the opposing substrate 36, it is necessary to mount the driving IC 32 on the substrate 31 at a distance from the opposing substrate 36 of the liquid panel 350. Therefore, a driving IC mounting area on the substrate 31 is increased, thereby causing a problem of inevitably increasing the size of the liquid device 300.

The electronic apparatus equipped with the conventional liquid crystal device 300 also has a problem that an increase in an area for mounting the liquid crystal device makes it impossible to decrease the size and weight of the electronic apparatus.

OBJECTS AND SUMMARY OF THE INVENTION

Accordingly, an object of the present invention is to provide a liquid crystal device and a method of manufacturing the same which enable a decrease in an area for mounting a liquid crystal driving IC on the liquid crystal device while maintaining high reliability.

Another object of the present invention is to provide an electronic apparatus which is equipped with a liquid crystal device of the present invention whose size and weight are decreased.

Accordingly, a liquid crystal device includes a first substrate, a second substrate, a liquid crystal material, interconnecting lines and a driving element. The first substrate has opposite first and second main surfaces. The second substrate has opposite third and fourth main surfaces. The third main surface has first and second regions with the first region being disposed opposite to the second main surface of the first substrate.

The liquid crystal material is held between the second main surface of the first substrate and the first region of the second substrate. The interconnecting lines are provided on the third main surface of the second substrate. The driving element is provided on the second region of the third main surface of the second substrate to be electrically connected to the interconnecting lines. The driving element has opposite fifth and sixth main surfaces. The sixth main surface is opposite to the third main surface of the second substrate and a height of the fifth main surface from the third main surface is greater than a height of the first main surface of the first substrate from the third main surface.

In accordance with the above-mentioned structure, since the fifth main surface, i.e., upper surface, of the driving element is higher than the first main surface, i.e., upper surface, of the first substrate. For example, even when the driving element is COG-mounted on the second substrate of a compact liquid crystal panel with a small marginal area in which the distance between the driving element and the first substrate is decreased, a bonding tool for pressing the driving element does not contact the first substrate. This permits face-down bonding using a large bonding tool. As a result, the bonding tool can easily be maintained in parallel, and the heat capacity of the bonding tool is increased, thereby permitting facedown bonding with a more uniform load at a more uniform temperature. Thus, it is possible to provide a small liquid crystal device with high reliability in which bonding between the driving element and the panel interconnecting lines is sufficiently ensured.

Here, when the first substrate has a polarizing plate and other optical elements previously bonded thereto, the first main surface of the first substrate represents the first main surface of the first substrate including these optical elements, i.e., the upper surfaces of these optical elements. In this case, the upper surface of the driving element is higher than the upper surfaces of the optical elements, and thus the bonding tool is prevented from contacting the optical elements such as the polarizing plate, thereby exhibiting the above functions.

It is preferred that the height of the fifth main surface from the third main surface is 0.08 millimeters (mm) or greater than the height of the first main surface of the first substrate from the third main surface. It is also preferred that the height of the fifth main surface from the third main surface is 1.17 times or more than the height of the first main surface of the first substrate from the third main surface. Further, it is preferable that the height of the fifth main surface from the third main surface is 4.7 times or less than the height of the first main surface of the first substrate from the third main surface.

Preferably, a distance between the first substrate and the driving element is 2 mm or less thereby forming a space therebetween. Also, it is preferred that the driving element is face-down bonded to the second substrate. It is further preferred that driving element is bonded to the interconnecting lines through bumps. It is also preferred that the driving element is fixed to the second substrate with an adhesive, a combination of the adhesive and a conductive paste or an anisotropic conductive film.

Another embodiment of the liquid crystal device of the present invention includes the driving element having a thickness greater than a thickness of the first substrate.

In this construction, since the upper surface of the driving element is higher than the first main surface, i.e., the upper surface, of the first substrate, even when the driving element is COG-mounted on the second substrate of a compact liquid crystal panel with a narrow area in which a space between the driving element and the first substrate is decreased, the bonding tool for pressing the driving element does not contact the first substrate. Therefore, it is possible to perform face-down bonding using a large bonding tool. As a result, the bonding tool can easily be maintained parallel, and the heat capacity of the bonding tool can be increased, thereby permitting face-down bonding with a more uniform load at a more uniform temperature. It is thus possible to provided a liquid crystal device with high reliability in which bonding between the driving element and panel interconnecting lines is sufficiently ensured.

Here, when the first substrate has a polarizing plate and other optical elements previously been bonded thereto, the thickness of the first substrate represents the thickness of the first substrate including these optical elements. In this case, the upper surface of the driving element is higher than the upper surfaces of the optical elements, and the bonding tool is prevented from contacting the optical elements such as the polarizing plate, thereby exhibiting the above functions.

In accordance with this embodiment of the present invention, it is preferred that a thickness of the driving element is at least 0.08 mm greater than the thickness of the first substrate. Further, it is preferred that the thickness of the driving element is at least 1.17 times greater the thickness of the first substrate. Additionally, it is preferred that the thickness of the driving element is 4.7 times or less the thickness of the first substrate.

Another embodiment of the present invention is a method of manufacturing a liquid crystal device including the step of preparing a liquid crystal panel. The liquid crystal panel includes a first substrate having opposite first and second main surfaces, a second substrate having opposite third and fourth main surfaces with interconnecting lines being provided on the third main surface. The third main surface has first and second regions with the first region being disposed opposite to the second main surface of the first substrate. The liquid crystal panel also includes a liquid crystal material held between the second main surface of the first substrate and the first region of the second substrate.

The method of manufacturing the liquid crystal device also includes the step of pressing, by a bonding tool, a driving element having opposite fifth and sixth main surfaces and bumps provided on the sixth main surface to bond the bumps and the interconnecting lines and fix the driving element to the second substrate with a fixing member interposed between the sixth main surface of the driving element and the third main surface of the second substrate in the state wherein the sixth main surface of the driving element is disposed opposite to the second region of the third main surface of the second substrate, so that, when the driving element is mounted on the third main surface, a height of the fifth main surface from the third main surface is greater than a height of the first main surface of the first substrate from the third main surface.

In this manufacturing method, since the driving element is pressed from the upper side in the state where the fifth main surface, i.e., upper surface, thereof is higher than the first main surface, i.e., the upper surface, of the first substrate, even when the driving element is COG-mounted on the second substrate of a compact liquid crystal panel with a narrow marginal area in which the distance between the driving element and the first substrate is decreased, the bonding tool for pressing the driving element does not contact the first substrate. This permits face-down bonding by a large bonding tool. As a result, the bonding tool can easily be maintained in parallel, and the heat capacity of the bonding tool can be increased, thereby permitting facedown bonding with a more uniform load at a more uniform temperature. It is thus possible to produce a small liquid crystal device with high reliability in which bonding of the driving element and panel interconnecting lines is sufficiently ensured.

Here, when the first substrate used has a polarizing plate and other optical elements bonded thereto, the first main surface of the first substrate represents the first main surface of the first substrate including these optical elements, i.e., the upper surfaces of the optical elements. In this case, the upper surface of the driving element is higher than the upper surfaces of the optical elements, and the bonding tool is prevented from contacting the optical elements such as the polarizing plate, thereby exhibiting the above functions.

An alternative embodiment of the method of the present invention of manufacturing a liquid crystal device includes the steps of preparing the liquid crystal panel pressing the driving element with the fixing member in a state where the sixth main surface of the driving element has a greater thickness than that of the first substrate.

In this manufacturing method, since the driving element is pressed from the upper side with the upper surface thereof higher than the first main surface, i.e., the upper surface, of the first substrate, even when the driving element is COG-mounted on the second substrate of a compact liquid crystal panel with a narrow marginal area in which a space between the driving element and the first substrate is decreased, the bonding tool for pressing the driving element does not contact the first substrate. This permits face-down bonding by a large bonding tool. As a result, the bonding tool can easily be maintained in parallel, and the heat capacity of the bonding tool can be increased, thereby permitting face-down bonding with a more uniform load at a more uniform temperature. It is thus possible to produce a small liquid crystal device with high reliability in which bonding of the driving element and panel interconnecting lines is sufficiently ensured.

Here, when the first substrate has a polarizing plate and other optical elements bonded thereto, the thickness of the first substrate represents the thickness of the first substrate including these optical elements. In this case, the upper surface of the driving element is higher than the upper surfaces of the optical elements, and the bonding tool is prevented from contacting the optical elements such as the polarizing plate, thereby exhibiting the above functions.

Preferably, the driving element is fixed to the second substrate at a distance of 2 mm or less between the first substrate and the driving element. When the distance between the first substrate and the driving element is 2 mm or less, the above effects are effectively exhibited.

It is preferred that the fixing member is an adhesive. When bonding with an adhesive as the fixing member by using the bonding tool under pressure, the driving element is bonded directly to the panel interconnecting lines in a state wherein only the adhesive is present between the respective bumps, thereby resulting in less short-circuits between the bumps. It is thus possible to cope with high-fineness bump pitches.

Alternately, a conductive paste is used so that the bumps are bonded to the interconnecting lines through the conductive paste and the driving element is fixed to the second substrate with the adhesive. Bonding of the bumps and the interconnecting lines through the conductive paste can relieve variations in the thickness of the driving element and variations in flatness of the bonding tool, and thus improve the yield of the COG process and ensure high reliability. A silver paste is preferably used as the conductive paste.

Also, as an alternative, the fixing member is an anisotropic conductive film comprising an adhesive and conductive particles. This fixing member causes the conductive particles to take a part in connection, and can relieve variations in the thickness of driving IC and variations in flatness of the bonding tool, and thus improve the yield of the COG process and ensure high reliability.

As yet another alternative, the adhesive is a thermosetting adhesive so that the driving element is heated while being pressed by the bonding tool to be fixed to the second substrate with the adhesive.

According with the present invention, since the bonding tool for pressing the driving element does not contact the first substrate, as described above, face-down bonding can be performed by using a large bonding tool. Consequently, the heat capacity of the bonding tool can be increased, thereby permitting face-down bonding at more uniform temperature. The present invention is particularly effective to heat the driving element by the bonding tool.

It is preferable that the driving element is heated while being pressed by the bonding tool in order to be bonded to the second substrate with the thermosetting adhesive. The driving element is then cooled to a predetermined temperature by stopping the heating process of the bonding tool while under pressure by the bonding tool, and pressing by the bonding tool is then also stopped. With this bonding technique, since the viscosity (elastic modules) increases with a decrease in temperature due to the correlation between the temperature and viscosity (elastic modules), the driving element can securely be fixed and bonded. This is referred to as "the hot-cold effect" which improves the adhesive force of the adhesive used.

Another type of the adhesive is a thermosetting adhesive so that the adhesive is heated by irradiating it with light while pressing the driving element by the bonding tool to fix the driving element to the second substrate with the adhesive. In this way, the adhesive can also be heated by light. In this case, visible light or ultraviolet light can be preferably used as light. As the second substrate, a transparent substrate is preferably used. In this case, light is preferably applied from the main surface side of the second substrate.

Preferably, the thermosetting adhesive is heated by light while pressing the driving element by the bonding tool to fix the driving element to the second substrate with the adhesive. The thermosetting adhesive is then cooled to a predetermined temperature by stopping the heating process by light while pressing the driving element by the bonding tool. Pressing by the bonding tool is then stopped. The adhesive force of the adhesive is improved by the hot-cold effect.

The adhesive preferably is cured by irradiating it with light while pressing the driving element by the bonding tool to fix the driving element to the second substrate with the adhesive. This type of bonding can maintain the temperature at a low temperature during cure bonding of the adhesive, and can thus decrease the heat effect on the panel. In this case, visible light or ultraviolet light is preferably used. As the second substrate, a transparent substrate is preferably used. In this case, light can be applied from the side of the fourth main surface of the second substrate.

A skilled artisan would appreciate that a liquid crystal device or an electronic apparatus comprising a liquid crystal device can be manufactured by the method described above. A skilled artisan would further appreciate that the electronic apparatus is small, lightweight and thin while having a high reliability. Additionally, transparent glass is preferably used although a transparent resin may also be used.

These and other objects of the present invention will become more readily appreciated and understood from consideration of the following detailed description of the preferred embodiments of the present invention when taken in conjunction with the accompanying drawings.

BRIEF DESCRIPTION OF THE DRAWINGS

FIG. 4 is a cross-sectional view illustrating a liquid crystal device in accordance with a second preferred embodiment of the present invention;

FIG. 5 is a cross-sectional view illustrating the liquid crystal device in accordance with the second embodiment of the present invention;

DETAILED DESCRIPTION OF PREFERRED EMBODIMENTS

Figure 1:
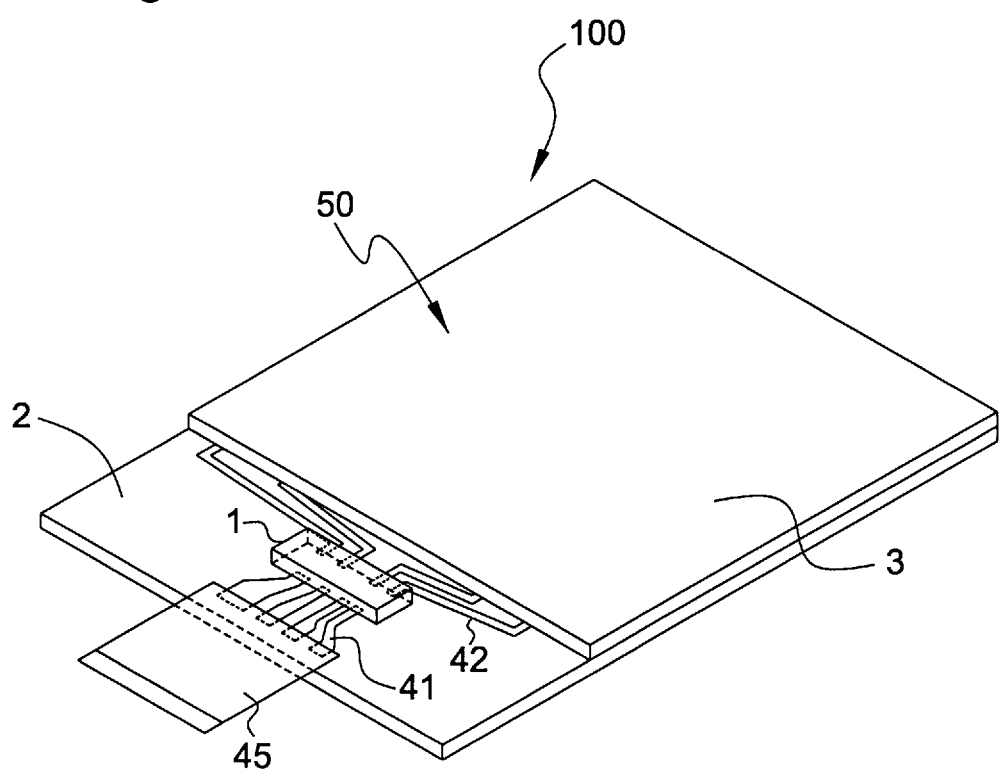
FIG. 1 is a perspective view illustrating a liquid crystal device in accordance with the preferred embodiments of the present invention.

FIG. 1 is a perspective view illustrating a liquid crystal device in accordance with the preferred embodiments of the present invention.

A liquid crystal device 100 according to each of the embodiments comprises a liquid crystal panel 50 including a substrate 2, an opposing substrate 3, a liquid crystal material 52 (shown in FIG. 2) held between these substrates, a driving IC 1 and a flexible printed board 45. On the substrate 2 are provided interconnecting lines 41 for connecting to the output terminals of the driving IC 1, and interconnecting lines 42 for connecting to the input terminals of the driving IC 1 with the driving IC 1 being connected to the interconnecting lines 41 and 42 and provided on the substrate 2. The flexible printed board 45 is connected to the interconnecting lines 42.

Figure 2:
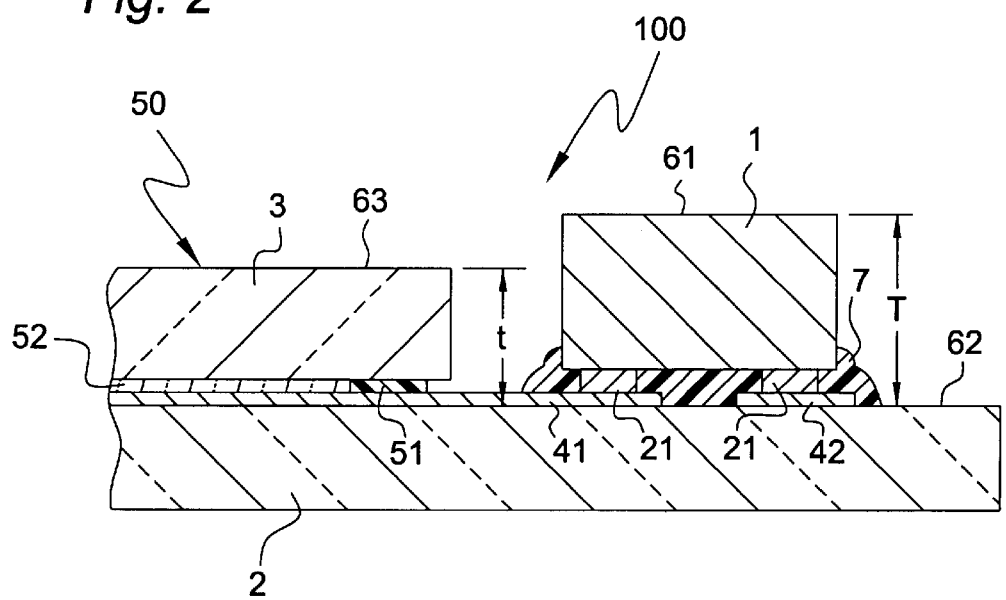
FIG. 2 is a cross-sectional view illustrating a liquid crystal device in accordance with a first preferred embodiment of the present invention.
Figure 3:
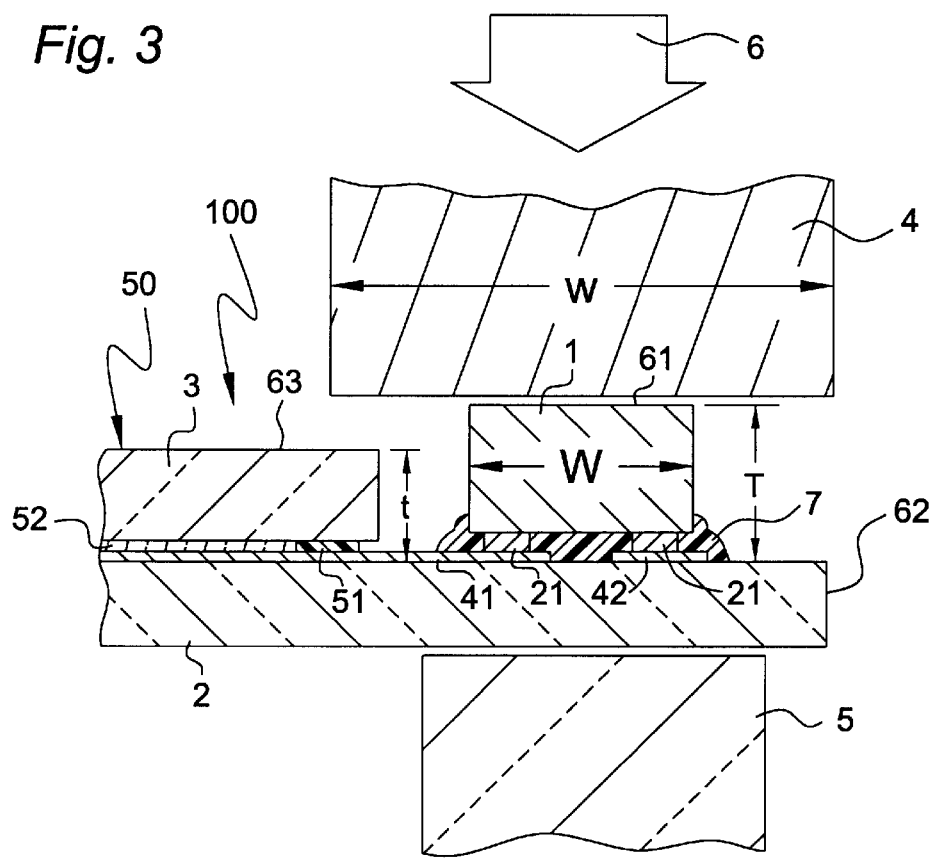
FIG. 3 is a cross-sectional view illustrating a liquid crystal device in accordance with the first preferred embodiment of the present invention.

FIGS. 2 and 3 are cross-sectional views illustrating a liquid crystal device in accordance with a first embodiment of the present invention.

Referring FIG. 2, the liquid crystal device 100 comprises the liquid crystal panel 50 and the driving IC 1. A seal 51 is provided in the periphery between the substrate 2 and the opposing substrate 3 so that a liquid crystal material 52 is sealed between the substrate 2 and the opposing substrate 3 with the seal 51 therebetween. On an upper surface 62 of the substrate 2 are provided the interconnecting lines 41 for connecting to the output terminals of the driving IC 1 and the interconnecting lines 42 for connecting to the input terminals of the driving IC 1. The driving IC 1 is connected to the interconnecting lines 41 and 42 though a plurality of input-output bumps 21 to be bonded face down to the substrate 2. The driving IC 1 is bonded to the substrate with an adhesive 7. Thickness T of the driving IC 1 is greater than a thickness t of the opposing substrate 3 of the liquid crystal panel 50. Thus, an upper surface 61 of the driving IC 1 is disposed higher than an upper surface 63 of the opposing substrate 3 of the liquid crystal panel 50.

The method of manufacturing the liquid crystal device 100 will be described below with reference to FIG. 3.

First, the liquid crystal panel 50 having the liquid crystal material 52 sealed between the substrate 2 and the opposing substrate 3 with the seal 51 therebetween is prepared. Then, an adhesive 7 is provided on the substrate 2 of the liquid crystal panel 50, and the input-output bumps 21 of the driving IC 1 are respectively aligned with the corresponding interconnecting lines 41 and 42. The upper surface 61 of the driving IC 1 is then heated and pressed by a bonding tool 4 to electrically and mechanically bond the input/output bumps 21 of the driving IC 1 to the interconnecting lines 41 and 42, as well as bonding the driving IC 1 to the upper surface 62 of the substrate 2 with the adhesive 7. The adhesive 7 is a thermosetting epoxy adhesive, and bonding conditions include a temperature of 220° C., a pressure of 5 gf/mm$^2$ (grams force per square millimeter), and a time of 20 seconds. Thereafter, heating by the bonding tool 4 is stopped under pressure by the bonding tool 4 to decrease the temperature to 150° C., and the pressing by the bonding tool 4 is then stopped. This bonding improves the adhesive force of the adhesive 7 by a "hot-cold effect". A pedestal 5 is made of quartz glass so that light can be applied to the adhesive 7 through the substrate 2.

The need for decreasing the mounting area of the driving IC 1 causes the need to decrease the distance between the driving IC 1 and the opposing substrate 3 of the liquid crystal panel 50. This distance is conventionally 1 mm or more, and typically about 2 to 3 mm. However, this distance has recently been decreased to about 0.5 mm. Therefore, as this distance decreases, the distance between the bonding tool 4 used for bonding the driving IC 1 and the opposing substrate 3 decreases. As shown in FIG. 3, a width "w" of the bonding tool 4 is larger than a width "W" of the driving IC in order to securely bond it. In this case, the conventional bonding method causes interference between the bonding tool 4 and the opposing substrate 3, and is thus difficult to sufficiently bond the driving IC 1.

In this first preferred embodiment, the thickness T of the driving IC 1 is 0.56 mm, and the thickness t of the opposing substrate 3 of the liquid crystal panel 50 is 0.4 mm (the thickness t strictly including the cell thickness of the panel, about 0.001 to 0.02 mm). The height of the upper surface 61 of the driving IC 1 from the upper surface 62 of the substrate 2 is 0.56 mm, and the height of the upper surface 63 of the opposing substrate 3 from the upper surface 62 of the substrate 2 is 0.4 mm. The material of the substrate 2 and the opposing substrate 3 is soda glass. The distance between the driving IC 1 and the opposing substrate 3 is 0.5 mm, the width W of the driving IC 1 is 2.02 mm, and the width w of the bonding tool 4 is 4.0 mm.

In this first preferred embodiment, the thickness T of the driving IC 1 is 1.4 times the thickness t of the opposing substrate 3, and a gap of 0.16 mm is secured between the bonding tool 4 and the opposing substrate 3. However, it is considered, based on the variations obtained from experimental results that, with a gap of about 0.08 mm at a minimum, the same effects as described above can be obtained. Hence, the thickness T of the driving IC 1 may be 1.17 times or more, i.e., about 1.2 times or more, than the thickness t of the opposing substrate 3.

In this first preferred embodiment, since the thickness T of the driving IC 1 is greater than the thickness t of the opposing substrate 3 of the liquid crystal panel 50, a certain gap is secured between the bonding tool 4 and the opposing substrate 3 during bonding. It is thus possible to carry out face-down bonding by using a large bonding tool 4. Consequently, the bonding tool 4 can easily be maintained in parallel, and the heat capacity of the bonding tool 4 can be increased, thereby permitting face-down bonding with a more uniform load at a more uniform temperature. Therefore, the driving IC 1 can sufficiently be heated and pressed without contact between the bonding tool 4 and the opposing substrate 3, thereby enabling bonding with high reliability. It is also possible to prevent breakage of the opposing substrate 3 and suppress the heat effect of the bonding tool 4 on the liquid crystal panel 50.

Further, the direct bonding of the bumps 21 of the driving IC 1 to the interconnecting lines 41 and 42 with the adhesive 7 allows only the adhesive 7 to be present between the respective bumps 21. This prevents the occurrence of short-circuits between the bumps 21 and makes it possible to cope with high-fineness bump pitches.

FIGS. 4 and 5 are cross-sectional views illustrating a liquid crystal device in accordance with a second preferred embodiment of the present invention.

Referring FIG. 4, the liquid crystal device 100 differs from the first preferred embodiment of the present invention in that a polarizing plate 11 is provided on the upper surface 63 of the opposing substrate 3 and a second polarizing plate 12 is provided on a lower surface 65 of the substrate 2. Otherwise, this second preferred embodiment is the same as the first preferred embodiment. The liquid crystal device may be a reflective type in which a reflecting plate is provided on the polarizing plate 12 on the lower surface 65 of the substrate 2.

In this second preferred embodiment, the thickness T of the driving IC 1 is greater than the total thickness t' of the thickness of the opposing substrate 3 of the liquid crystal panel 50 and the thickness of the polarizing plate 11. The upper surface 61 of the driving IC 1 is higher than an upper surface 64 of the polarizing plate 11 provided on the opposing substrate 3 of the liquid crystal panel 50.

The method of manufacturing the liquid crystal device 100 will be described below with reference to FIG. 5.

In this second preferred embodiment, although the liquid crystal device 100 is manufactured by the same method as the first preferred embodiment, the thickness T of the driving IC 1 is 0.56 mm, and the total thickness t' equals the thickness (0.3 mm) of the opposing substrate 3 of the liquid crystal panel 50 and a thickness (0.18 mm) of the polarizing plate 11 which, in this case, is 0.48 mm (the thickness t' strictly including the cell thickness of the panel, about 0.001 to 0.02 mm). The height of the upper surface 61 of the driving IC 1 from the upper surface 62 of the substrate 2 is 0.56 mm, and the height of the upper surface 64 of the polarizing plate 11 on the opposing substrate 3 from the upper surface 62 of the substrate 2 is 0.48 mm. The distance between the driving IC 1 and the opposing substrate 3 is 0.5 mm; the width W of the driving IC 1 is 2.02 mm and the width w of the bonding tool 4 is 4.0 mm.

In this second preferred embodiment, the thickness T of the driving IC 1 is 1.17 times the total thickness t' of the thickness of the opposing substrate 3 and the thickness of the polarizing plate 11 combined, and a gap of 0.08 mm is secured between the bonding tool 4 and the opposing substrate 3.

In this second preferred embodiment, since the thickness of the driving IC 1 is greater than the total thickness of the thickness of the opposing substrate 3 of the liquid crystal panel 50 and the thickness of the polarizing plate 11 combined, a certain distance is secured between the bonding tool 4 and the polarizing plate 11 during bonding. It is thus possible to carry out face-down bonding by using a large bonding tool 4. Consequently, the bonding tool 4 can easily be maintained in parallel, and the heat capacity of the bonding tool 4 can be increased, thereby permitting face-down bonding with a more uniform load at a more uniform temperature. Hence, the driving IC 1 can sufficiently be heated and pressed without contact between the bonding tool 4 and the polarizing plate 11, thereby enabling bonding with high reliability. Further, it is possible to prevent breakage of the opposing substrate 3 and the polarizing plate 11, and suppress the heat effect of the bonding tool 4 on the liquid crystal panel 50 to a low level.

Figure 6:
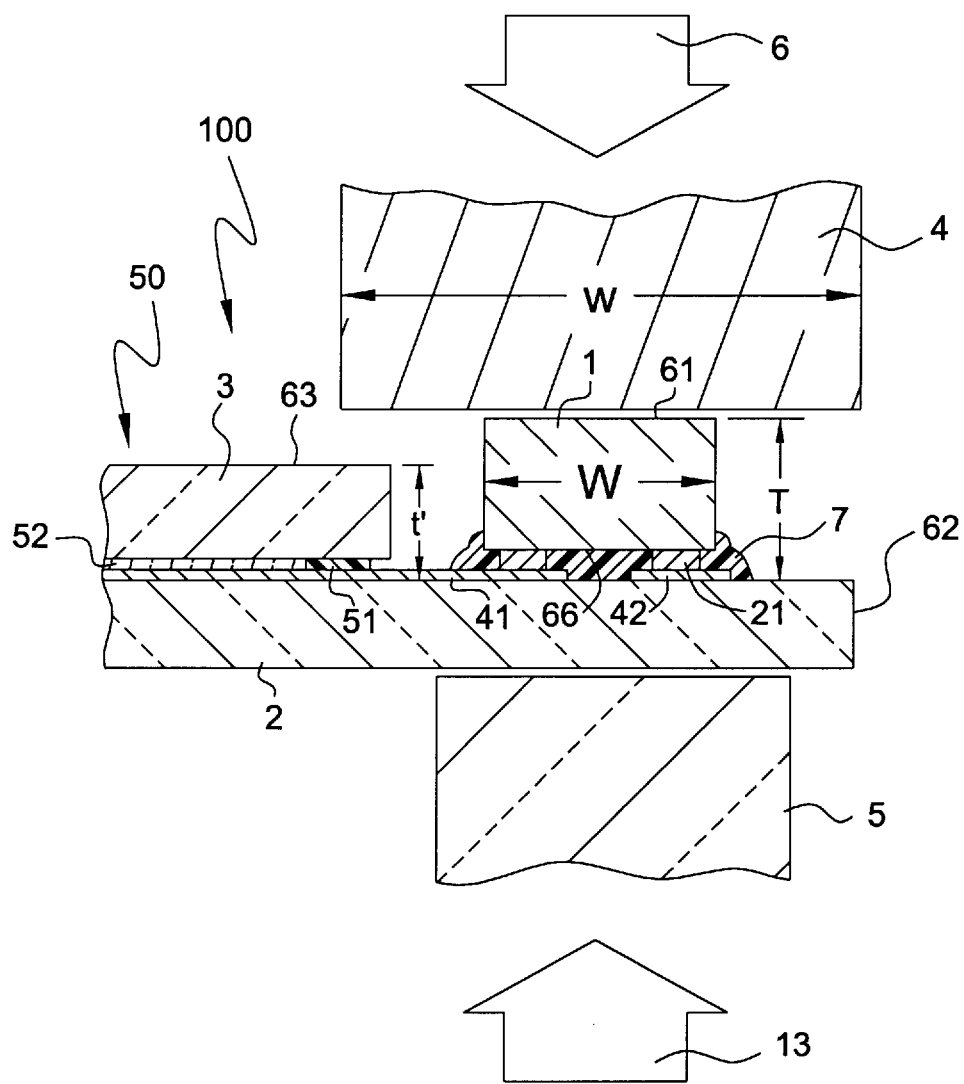
FIG. 6 is a cross-sectional view illustrating a liquid crystal device in accordance with a third preferred embodiment of the present invention.

FIG. 6 is a cross-sectional view illustrating a liquid crystal device in accordance with a third preferred embodiment of the present invention. The liquid crystal device 100 of this third preferred embodiment has the same structure as the liquid crystal device 100 of the first preferred embodiment described above with reference to FIG. 2 except that the adhesive 7 used in this embodiment is a thermosetting epoxy adhesive.

The method of manufacturing the liquid crystal device 100 of the third preferred embodiment will be described below with reference to FIG. 6.

First, the liquid crystal panel 50 comprising the liquid crystal material 52 sealed with the seal 51 between the substrate 2 and the opposing substrate 3 is prepared. The adhesive 7 is then provided on the substrate 2 of the liquid crystal panel 50 and the input/output bumps 21 of the driving IC 1 are then respectively aligned with the corresponding interconnecting lines 41 and 42. Thereafter, the driving IC 1, the interconnecting lines 41 and 42, the bumps 21 and the adhesive 7 are heated by applying near-infrared and/or visible light(represented by arrow 13) generated by a xenon lamp or the like to a bonding surface 66 of the driving IC 1 from a lower side of the pedestal 5 made of quartz glass while pressing the upper surface 61 of the driving IC 1 by the bonding tool 4 to electrically and mechanically bond the input/output bumps 21 of the driving IC 1 and the interconnecting lines 41 and 42, as well as bonding the driving IC 1 to the upper surface 62 of the substrate 2 with the adhesive 7. The bonding conditions include a temperature of 220° C., a pressure of 5 gf/mm$^2$, a time of 20 seconds, and a quantity of the light 13. The quantity of light 13 is applied and the pressure is set so as to establish these conditions. Then, heating by the light 13 is stopped to decrease the temperature to 150° C. under pressing by the bonding tool 4 and pressure by the bonding tool 4 is then stopped. This improves an adhesive force of the adhesive 7 due to the "hot-cold effect".

The bonding tool 4 may be heated by a heater or the like. In this case, the temperature of the bonding tool 4 may be 30° C. to 200° C. lower than that in the first preferred embodiment.

In this third preferred embodiment, the thickness T of the driving IC 1 is 0.56 mm, and the thickness t of the opposing substrate 3 of the liquid crystal panel 50 is 0.4 mm (the thickness t strictly including the cell thickness of the panel of about 0.001 to 0.02 mm). The height of the upper surface 61 of the driving IC 1 from the upper surface 62 of the substrate 2 is 0.56 mm, and the height of the upper surface 63 of the opposing substrate 3 from the upper surface 62 of the substrate 2 is 0.4 mm. The material of the substrate 2 and the opposing substrate 3 is soda glass. The distance between the driving IC 1 and the opposing substrate 3 is 0.5 mm; the width W of the driving IC 1 is 2.02 mm, and the width w of the bonding tool 4 is 4.0 mm.

In this third preferred embodiment, the thickness T of the driving IC 1 is 1.4 times the thickness t of the opposing substrate 3, and a gap of 0.16 mm is secured between the tool 4 and the opposing substrate 3. However, even in heating by the xenon lamp from the lower side of the pedestal 5, as in this embodiment, it is considered, based on the variations obtained from experimental results, that with a gap of about 0.08 mm at a minimum, the same effects as described above can be obtained. Hence, the thickness T of the driving IC 1 may be 1.17 times or more, i.e., about 1.2 times or more, than the thickness t of the opposing substrate 3.

In this third preferred embodiment, since the thickness T of the driving IC is greater than the thickness t of the opposing substrate 3 of the liquid crystal panel 50, a certain distance is secured between the bonding tool 4 and the opposing substrate 3 during bonding. Thus, it is possible to carry out face-down bonding by using a large bonding tool 4. Consequently, the bonding tool 4 can easily be maintained in parallel, thereby permitting face-down bonding with a more uniform load. Hence, the driving IC 1 can sufficiently be pressed without breakage of the opposing substrate 3 due to contact of the bonding tool 4 therewith, thereby enabling bonding with high reliability. In addition, the use of light irradiation permits a decrease in the temperature of the bonding tool 4 and, thus, can significantly decrease the heat effect on the liquid crystal panel 50.

Figure 7:
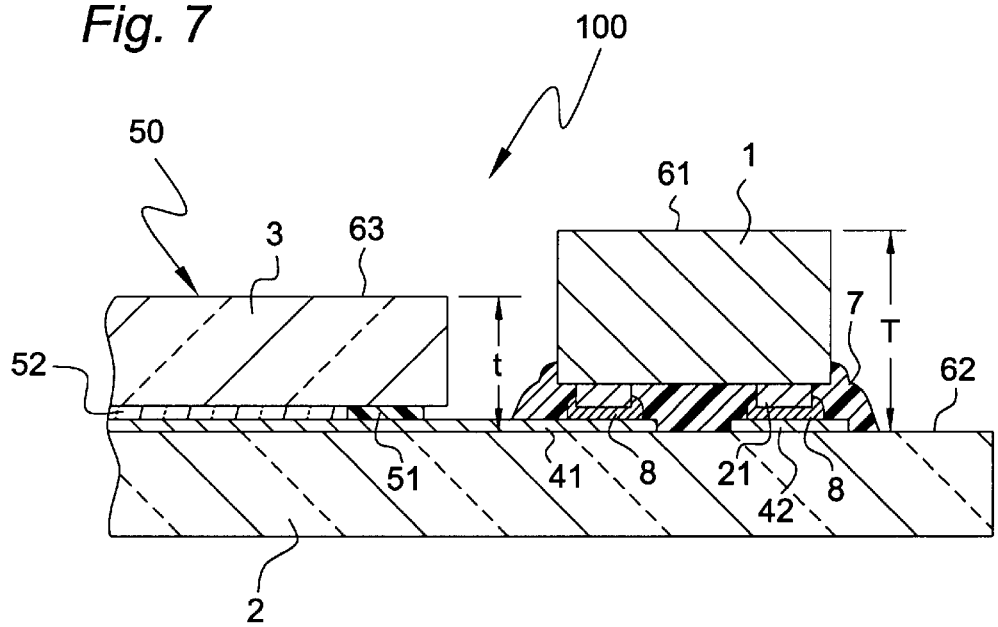
FIG. 7 is a cross-sectional view illustrating a liquid crystal device in accordance with a fourth preferred embodiment of the present invention.
Figure 8:
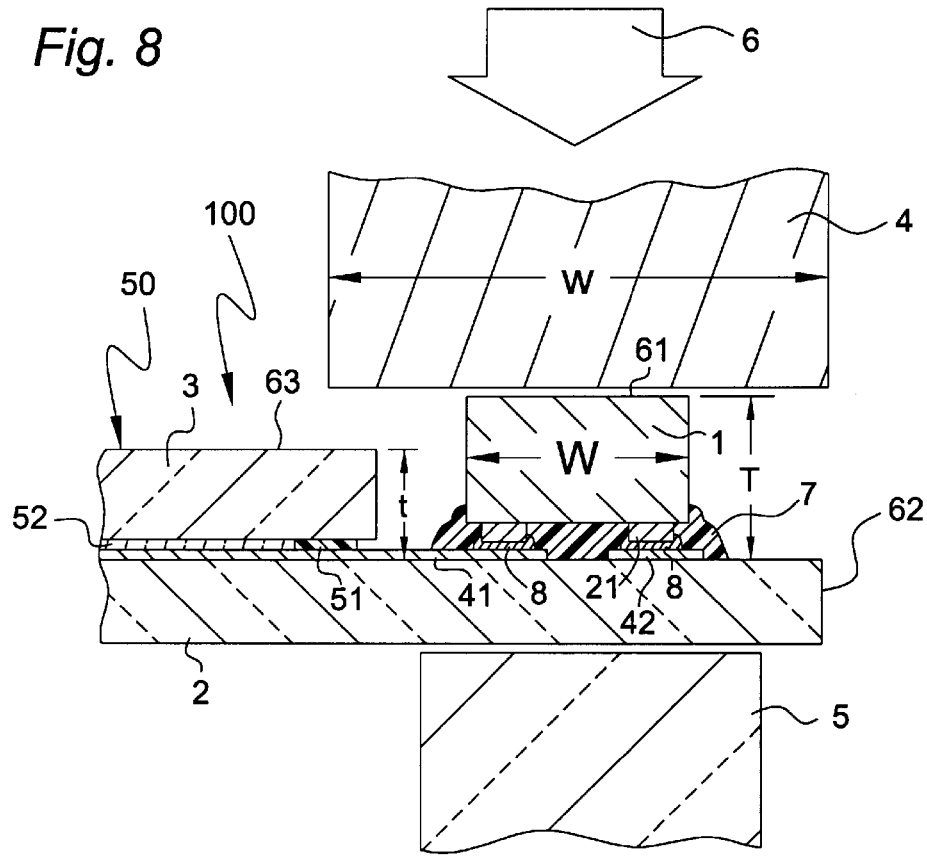
FIG. 8 is a cross-sectional view illustrating the liquid crystal device in accordance with the fourth preferred embodiment of the present invention.

FIG. 7 and 8 are cross-sectional views illustrating a liquid crystal device in accordance with a fourth preferred embodiment of the present invention.

Referring to FIG. 7, the liquid crystal device 100 differs from the first preferred embodiment in that the bumps 21 of the driving IC 1 are respectively bonded to the interconnecting lines 41 and 42 through a silver paste 8 but is otherwise the same as the first preferred embodiment.

In this fourth preferred embodiment, the thickness T of the driving IC 1 is greater than the thickness t of the opposing substrate 3 of the liquid crystal panel 50, and the upper surface 61 of the driving IC 1 is higher than the upper surface 63 of the opposing substrate 3 of the liquid crystal panel 50. In this fourth preferred embodiment, the thickness T of the driving IC 1 strictly includes the thickness of the driving IC 1, the thickness of the silver paste 8 and the thickness of the interconnecting lines 41 and 42.

The method of manufacturing the liquid crystal device 100 will be described below with reference to FIG. 8. First the liquid crystal panel 50 comprising the liquid crystal material 52 sealed between the substrate 2 and the opposing substrate 3 with the seal 51 therebetween is prepared. Then, the silver paste 8 is adhered to the input/output bumps 21 of the driving IC 1.

The adhesive 7 is then provided on the substrate 2 of the liquid crystal panel 50 and the input/output bumps 21 of the driving IC 1 are respectively aligned with the corresponding interconnecting lines 41 and 42. Thereafter, the upper surface 61 of the driving IC 1 is heated and pressed by the bonding tool 4 to electrically and mechanically bond the input/output bumps 21 of the driving IC 1 to the interconnecting lines 42 and 41 through the silver paste 8, as well as bonding the driving IC 1 to the upper surface 62 of the substrate 2 with the adhesive 7. The adhesive 7 is a thermosetting epoxy adhesive and the bonding conditions include a temperature of 220° C., a pressure of 5 gf/mm² and a time of 20 seconds. Then, heating by the bonding tool 4 is stopped to decrease the temperature to 150° C. under pressure by the bonding tool 4, and pressing by the bonding tool 4 is then stopped.

In this fourth preferred embodiment, the thickness T of the driving IC is 0.56 mm, and the thickness t of the opposing substrate 3 of the liquid crystal panel 50 is 0.4 mm (the thickness t strictly including the cell thickness of the panel, about 0.001 to 0.2 mm). The height of the upper surface 61 of the driving IC 1 from the upper surface 62 of the substrate 2 is 0.56 mm and the height of the upper surface 63 of the opposing substrate 3 from the upper surface 62 of the substrate 2 is 0.4 mm. The distance between the driving IC 1 and the opposing substrate 3 is 0.5 mm; the width W of the driving IC is 2.02 mm and the width w of the bonding tool 4 is 4.0 mm.

In this fourth preferred embodiment, the thickness T of the driving IC 1 is 1.4 times the thickness t of the opposing substrate 3 and a gap of 0.16 mm is secured between the bonding tool 4 and the opposing substrate. However, even when the input/output bumps 21 of the driving IC 1 are respectively bonded to the interconnecting lines 41 and 42 through the silver paste 8, as in this fourth preferred embodiment, it is considered, based on the variations obtained from experimental results, that with a gap of about 0.08 mm at a minimum, the same effects as described above can be obtained. Therefore, the thickness T of the driving IC may be 1.17 times or more, i.e., about 1.2 times or more, than the thickness t of the opposing substrate 3.

In this fourth preferred embodiment, since the input/output bumps 21 of the driving IC 1 are respectively bonded to the interconnecting lines 41 and 42 through the silver paste 8, it is possible to relieve variations in the thicknesses of the driving IC 1 and the input/output bumps 21, and in the flatness of the bonding tool 4.

Figure 9:
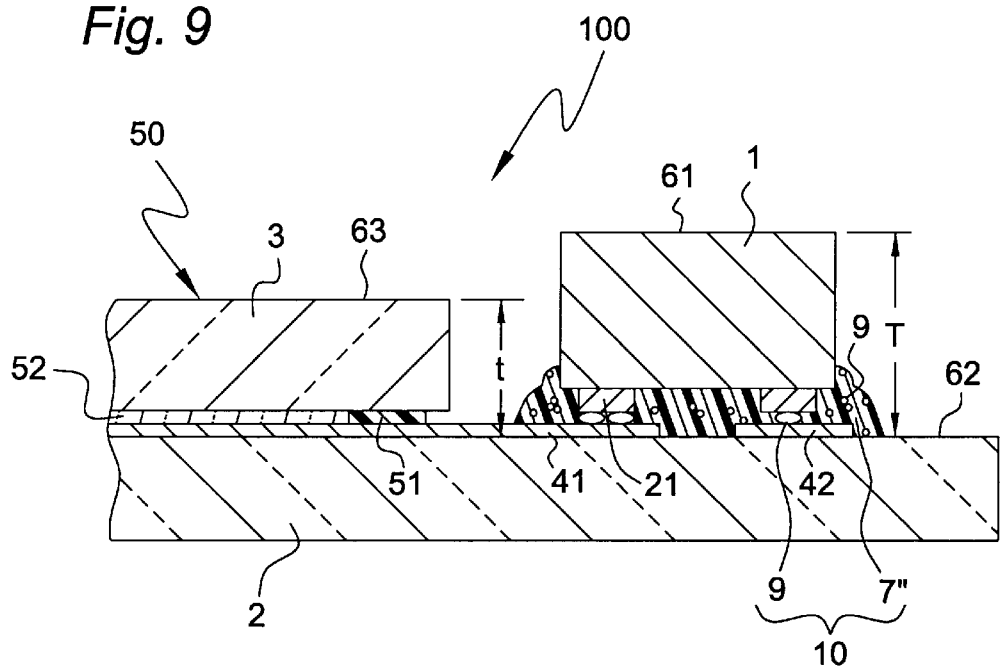
FIG. 9 is a cross-sectional view illustrating a liquid crystal device in accordance with a fifth preferred embodiment of the present invention.
Figure 10:
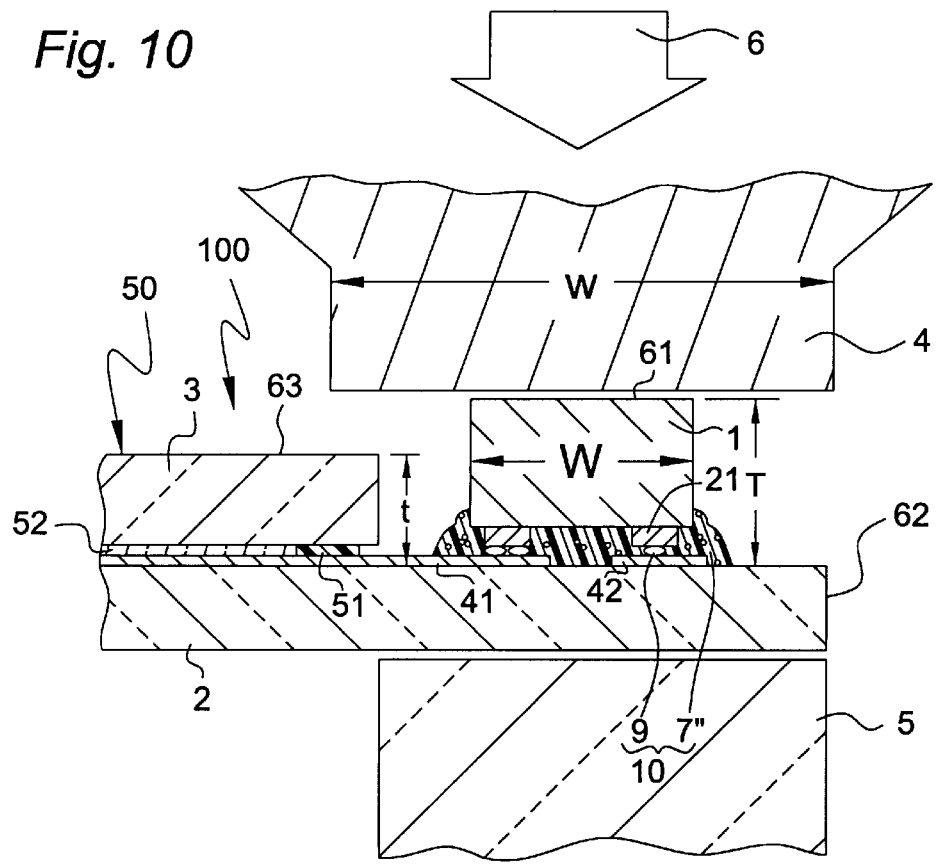
FIG. 10 is a cross-sectional view illustrating the liquid crystal device in accordance with the fifth preferred embodiment of the present invention.

Figs. 9 and 10 are cross-sectional views illustrating a liquid crystal device in accordance with a fifth preferred embodiment of the present invention.

Referring FIG. 9, the liquid crystal device 100 differs from the first preferred embodiment in that the driving IC 1 is bonded to the upper surface 62 of the substrate 2 by using an anisotropic conductive film 10, but is otherwise the same as the first preferred embodiment.

The anisotropic conductive film 10 comprises conductive particles 9 comprising gold-plated resin balls dispersed in the adhesive 7' so that the bumps 21 of the driving IC 1 are respectively bonded to the interconnecting lines 41 and 42 through the conductive particles 9 and the driving IC 1 is bonded to the substrate 2 with the epoxy adhesive 7'.

In this fifth preferred embodiment, the thickness T of the driving IC 1 is greater than the thickness t of the opposing substrate 3 of the liquid crystal panel 50 and the upper surface 61 of the driving IC 1 is higher than the upper surface 63 of the opposing substrate 3 of the liquid crystal panel 50. The thickness T of the driving IC 1 strictly includes the thickness of the driving IC 1, the thickness of the bumps 21, the thickness of the conductive particles 9 and the thickness of the interconnecting lines 41 and 42.

The method of manufacturing the liquid crystal device 100 will be described below with reference to FIG. 10.

First, the liquid crystal panel 50 comprising the liquid crystal material 52 sealed between the substrate 2 and the opposing substrate 3 with the seal 51 therebetween. Then, the anisotropic conductive film 10 is provided on the substrate 2 of the liquid crystal panel 50 and the input/output bumps 21 of the driving IC 1 are respectively aligned with the corresponding interconnecting lines 41 and 42. Thereafter, the upper surface 61 of the driving IC 1 is heated and pressed by the bonding tool 4 to electrically and mechanically bond the input/output bumps 21 of the driving IC 1 to the interconnecting lines 41 and 42 through the conductive particles 9, as well as bonding the driving IC 1 to the upper surface 62 of the substrate 2 by the epoxy adhesive 7' in the anisotropic conductive film 10. The bonding conditions include a temperature of 220° C., a pressure of 5 gf/mm², and a time of 20 seconds. Then, heating by the bonding tool 4 is stopped to decrease the temperature to 150° C. under pressure by the bonding tool 4, and pressing by the bonding tool 4 is then stopped.

In this fifth preferred embodiment, the thickness T of the driving IC 1 is 0.56 mm, and the thickness t of the opposing substrate 3 of the liquid crystal panel 50 is 0.4 mm (the thickness t strictly including the cell thickness of the panel, about 0.001 to 0.02 mm). The height of the upper surface 61 of the driving IC 1 from the upper surface 62 of the substrate 2 is 0.56 mm, and the height of the upper surface 63 of the opposing substrate 3 from the upper surface 62 of the substrate 2 is 0.4 mm. The distance between the driving IC 1 and the opposing substrate 3 is 0.5 mm. The width W of the driving IC is 2.02 mm and the width w of the bonding tool 4 is 4.0 mm.

In this fifth preferred embodiment, the thickness T of the driving IC 1 is 1.4 times the thickness t of the opposing substrate 3 and the gap between the bonding tool 4 and the opposing substrate 3 is ensured at 0.16 mm. Even when the input/output bumps 21 of the driving IC 1 are respectively bonded to the interconnecting lines 41 and 42 through the conductive particles 9 of the anisotropic conductive film 10, as in this fifth preferred embodiment, it is considered, based on the variations obtained from experimental results, that with a gap of about 0.08 mm at a minimum, the same effects as described above can be obtained. Therefore, the thickness T of the driving IC 1 may be 1.17 times or more, i.e., about 1.2 times or more, than the thickness t of the opposing substrate 3.

In this fifth preferred embodiment, since the input/output bumps 21 of the driving IC 1 are respectively bonded to the interconnecting lines 41 and 42 through the anisotropic conductive film 10, the conductive particles 9 of the anisotropic conductive film 10 are involved in bonding and, thus, the variations in the thickness of the driving IC 1 and the input/output bumps 21 and in the flatness of the bonding tool 4 can be relieved.

Figure 11:
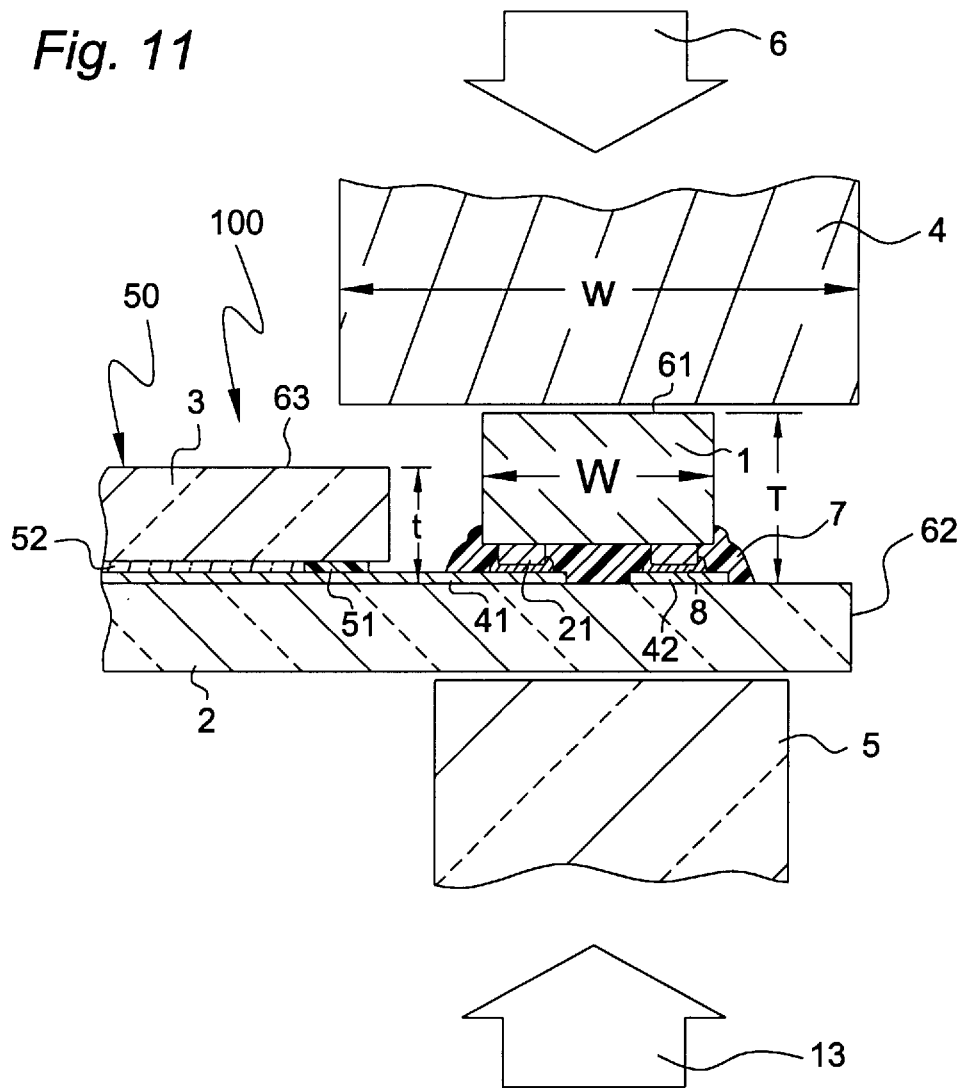
FIG. 11 is a cross-sectional view illustrating a liquid crystal device in accordance with a sixth preferred embodiment of the present invention.

FIG. 11 is a sectional view illustrating a liquid crystal device in accordance with a sixth preferred embodiment of the present invention.

The liquid crystal device 100 of this sixth preferred embodiment has the same structure as the liquid crystal device 100 of the fourth preferred embodiment described with reference to FIG. 7, i.e., the adhesive 7 is a thermosetting epoxy adhesive.

The method of manufacturing the liquid crystal device 100 will be described.

First, the liquid crystal 50 comprising the liquid crystal material 52 sealed between the substrate 2 and the opposing substrate 3 with the seal 51 therebetween is prepared. The silver paste 8 is adhered to the input/output bumps 21 of the driving IC 1. Then, the adhesive 7 is provided on the substrate 2 of the liquid crystal 50, and the input/output bumps 21 of the driving IC 1 are respectively aligned with the corresponding interconnecting lines 41 and 42. Thereafter, the driving IC 1, the interconnecting lines 41 and 42, the bumps 21, the silver paste 8 and the adhesive 7 are heated by applying near-infrared and/or visible light 13 generated by the xenon lamp or the like from the lower side of the pedestal 5 made of quartz glass while pressing the upper surface 61 of the driving IC 1 by the bonding tool 4, to electrically and mechanically bond the input/output bumps 21 of the driving IC 1 to the interconnecting lines 41 and 42 through the silver paste 8, as well as bonding the driving IC 1 to the upper surface 62 of the substrate 2 with the adhesive 7. The bonding conditions include a temperature of 220° C., a pressure of 5 gf/mm², and a time of 20 seconds. The quantity of the light applied and the pressure are set to establish these conditions. Then, heating by the light 13 is stopped to decrease the temperature to 150° C. under pressure by the bonding tool 4 and pressing by the bonding tool 4 is then stopped.

The bonding tool 4 may be heated by a heater or the like. In this case, the temperature of the bonding tool 4 is 30° C. to 200° C. lower than that in the fourth embodiment.

In this sixth preferred embodiment, the thickness T of the driving IC 1, the thickness t of the opposing substrate 3 of the liquid crystal panel 50, the height of the upper surface 61 of the driving IC 1 from the upper surface 62 of the substrate 2, the height of the upper surface 63 of the opposing substrate 3 from the upper surface of the substrate 2, the distance between the driving IC 1 and the opposing substrate 3, the width W of the driving IC 1 and the width w of the bonding tool 4 are the same as the fourth embodiment. This embodiment is also the same as the fourth embodiment in that the gap between the bonding tool 4 and the opposing substrate 3 is about 0.08 mm at a minimum, and the thickness T of the driving IC 1 may be 1.17 or more times, i.e., about 1.2 or more times, than the thickness t of the opposing substrate 3.

Figure 12:
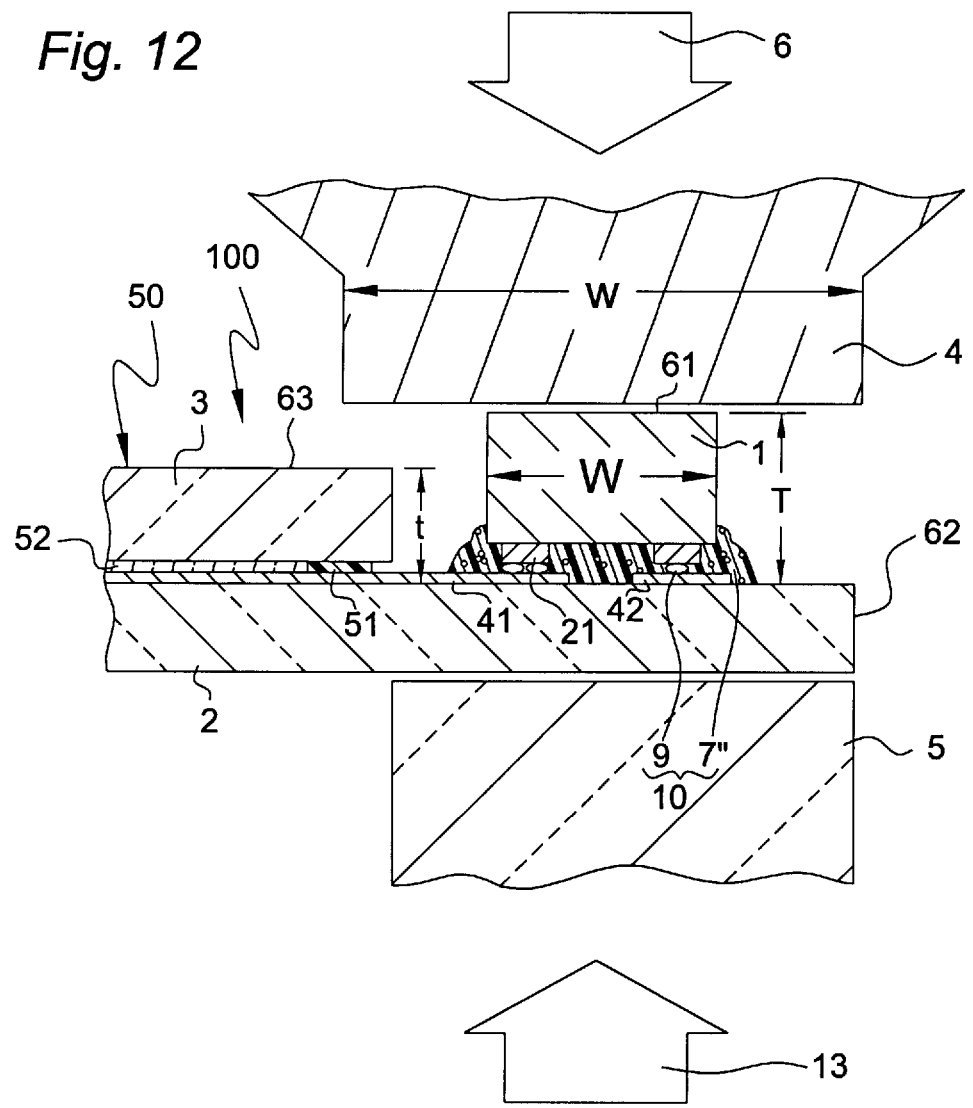
FIG. 12 is a cross-sectional view illustrating a liquid crystal device in accordance with a seventh preferred embodiment of the present invention.

FIG. 12 is a cross-sectional view illustrating a liquid crystal device in accordance with a seventh preferred embodiment of the present invention.

The liquid crystal device 100 of this seventh preferred embodiment has the same structure as the liquid crystal device 100 of the fifth embodiment described with reference to FIG. 9.

The method of manufacturing the liquid crystal device 100 will be described below.

First, the liquid crystal panel 50 comprising the liquid crystal material 52 sealed between the substrate 2 and the opposing substrate 3 with the seal 51 therebetween is prepared. Then, the anisotropic conductive film 10 is provided on the substrate 2 of the liquid crystal panel 50 and the input/output bumps 21 of the driving IC 1 are respectively aligned with the corresponding interconnecting lines 41 and 42. Thereafter, the driving IC 1, the interconnecting lines 41 and 42, the bumps 21, and the anisotropic conductive film 10 are heated by applying near-infrared and/or visible light 13 generated by the xenon lamp or the like from the lower side of the pedestal 5 made of quartz glass while pressing the upper surface 61 of the driving IC 1 by the bonding tool 4, to electrically and mechanically bond the input/output bumps 21 of the driving IC 1 to the interconnecting lines 41 and 42 through the conductive particles 9 of the anisotropic conductive film 10, as well as bonding the driving IC 1 to the upper surface 62 of the substrate 2 with the adhesive 7 of the anisotropic conductive film 10. The bonding conditions include a temperature 220° C., a pressure of 5 gf/mm², and a time of 20 seconds. The quality of the light applied and the pressure are set so as to establish these conditions. Then, heating by the light 13 is stopped to decrease the temperature to 150° C. under pressure by the bonding tool 4 and pressing by the bonding tool 4 is then stopped.

The bonding tool 4 may be heated by a heater or the like. In this case, the temperature of the bonding tool 4 may be 30° C. to 200° C. lower than that in the fifth preferred embodiment.

In this seventh preferred embodiment, the thickness T of the driving IC 1, the thickness t of the opposing substrate 3 of the liquid crystal panel 50, the height of the upper surface 61 of the driving IC 1 from the upper surface 62 of the substrate 2, the height of the upper surface 63 of the opposing substrate 3 from the upper surface 62 of the substrate 2, the distance between the driving IC 1 and the opposing substrate 3, the width W of the driving IC 1, and the width w of the bonding tool 4 are the same as the fifth preferred embodiment. This seventh preferred embodiment is also the same as the fifth preferred embodiment in that the gap between the bonding tool 4 and the opposing substrate 3 may be about 0.08 mm at a minimum, and the thickness T of the driving IC 1 may be 1.17 times or more, i.e., about 1.2 times or more, than the thickness t of the opposing substrate 3.

A liquid crystal device in accordance with an eighth preferred embodiment of the present invention is described with reference to FIGS. 2 and 3.

This eighth preferred embodiment differs from the first preferred embodiment in that the substrate 2 and the opposing substrate 3 used comprise a transparent resin composed of polyether sulfone (PES) as a base material and a blend-type adhesive containing epoxy-type adhesive and styrene-butadiene-styrene (SBS) type adhesive in a mixing ratio of about 8:2. Otherwise, this eighth preferred embodiment is the same as the first preferred embodiment in all other respects.

In this eighth preferred embodiment, the bonding conditions include a temperature of 130° C., a pressure of 4 gf/mm², and a time of 20 seconds. Then, heating by the bonding tool 4 is stopped to decrease the temperature to 100° C. under pressure by the bonding tool 4 and pressing by the bonding tool 4 is then stopped.

In this eighth preferred embodiment, the thickness T of the driving IC 1 is 0.56 mm, and the thickness t of the opposing substrate 3 of the liquid crystal panel 50 is 0.12 mm (the thickness t strictly including the cell thickness of the panel of about 0.001 to 0.02 mm). The height of the upper surface 61 of the driving IC 1 from the upper surface 62 of the substrate 2 is 0.56 mm and the height of the upper surface 63 of the opposing substrate 3 from the upper surface 62 of the substrate 2 is 0.12 mm. The distance between the driving IC 1 and the opposing substrate 3 is 0.5 mm. The width W of the driving IC 1 is 2.02 mm and the width w of the bonding tool 4 is 4.0 mm.

Here, the thickness T of the driving IC 1 is 4:7 times the thickness t of the opposing substrate 3 and a gap of 0.44 mm is secured between the bonding tool 4 and the opposing substrate 3.

In this eighth preferred embodiment, since the thickness of the driving IC 1 is made sufficiently greater than the thickness of the opposing substrate 3 of the liquid crystal panel 50, a certain distance is ensured between the bonding tool 4 and the opposing substrate 3 during bonding, and the driving IC 1 can sufficiently be heated and pressed without contact of the bonding tool 4 with the opposing substrate 3, thereby permitting bonding with high reliability. It is also possible to prevent breakage of the opposing substrate and suppress the heat effect of the bonding tool 4 on the liquid crystal panel 50 to a low level.

The liquid crystal device 100 of each of the embodiments is a preferred embodiment and the present invention is not, however, limited to the liquid crystal device 100 and the manufacturing method therefor according to each embodiment. For example, the adhesive 7 is not limited to the adhesive used in each of the embodiments, and styrene-butadiene-styrene (SBS) type, epoxy type, acrylic type, polyester type, urethane type adhesives and the like may be used singly or in combination or compound of at least two of these adhesives. This is true for the adhesive 7 of the anisotropic conductive film 10.

Although, in the third, sixth and seventh preferred embodiments, the thermosetting adhesive is used as the adhesive 7 so that it is heated by applying infrared and/or visible light by the xenon lamp from the lower side of the pedestal 5, a photosetting adhesive may be used as the adhesive 7. In this case, the adhesive is cured by applying ultraviolet light by a mercury lamp from the lower side of the pedestal 5. This causes only a small temperature rise by light irradiation and can, thus, cure the adhesive at a lower temperature of about 80° C. As the photosetting adhesive, an acrylic photosetting adhesive may preferably be used.

Furthermore, in order to protect exposed portions of the panel such as the interconnecting lines from moisture, dust, contact, etc., a molding agent or a coating agent may be coated onto the liquid crystal device.

Also, the conductive particles 9 used in the anisotropic conductive film 10 can be solder particles; particles of Ni, Au, Ag, Cu, Pd, Sn or the like; particles of a mixture or an alloy of some or all of these metals; composite metal particles obtained by plating; plastic particles (polystyrene, polycarbonate, acryl or the like) plated with at least one of Ni, Co, Pd, Au, Ag, Cu, Fe, Sn, Pb, etc; or carbon particles may be used.

In addition, the material of the substrates 2 and 3 of the liquid crystal panel is not limited to the material used in each of the preferred embodiments, and polycarbonate (PC), polyethylene terephthalate (PET), polyester (PS), polyether etherketone (PEEK), polyacrylate and the like may be used singly or as a composite resin comprising some of these resins.

Figure 13:
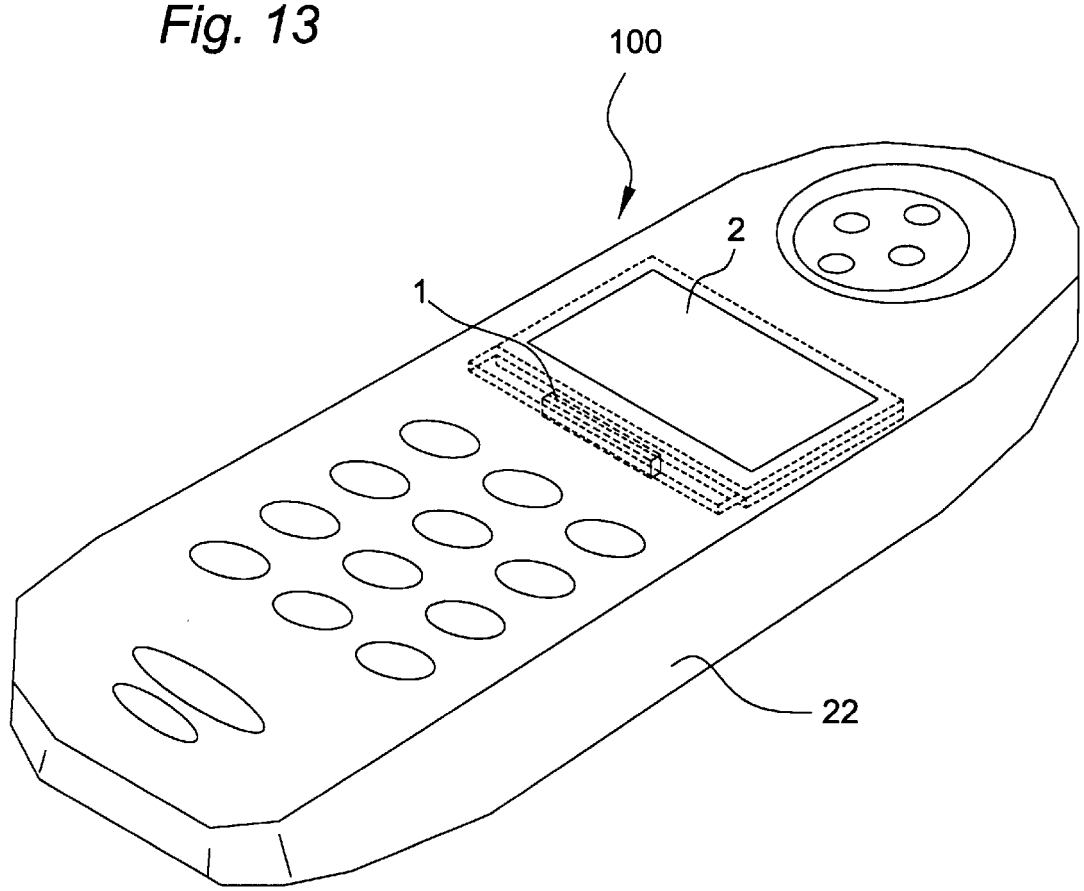
FIG. 13 is a cross-sectional view illustrating a liquid crystal device in accordance with an eighth preferred embodiment of the present invention.
Figure 14:
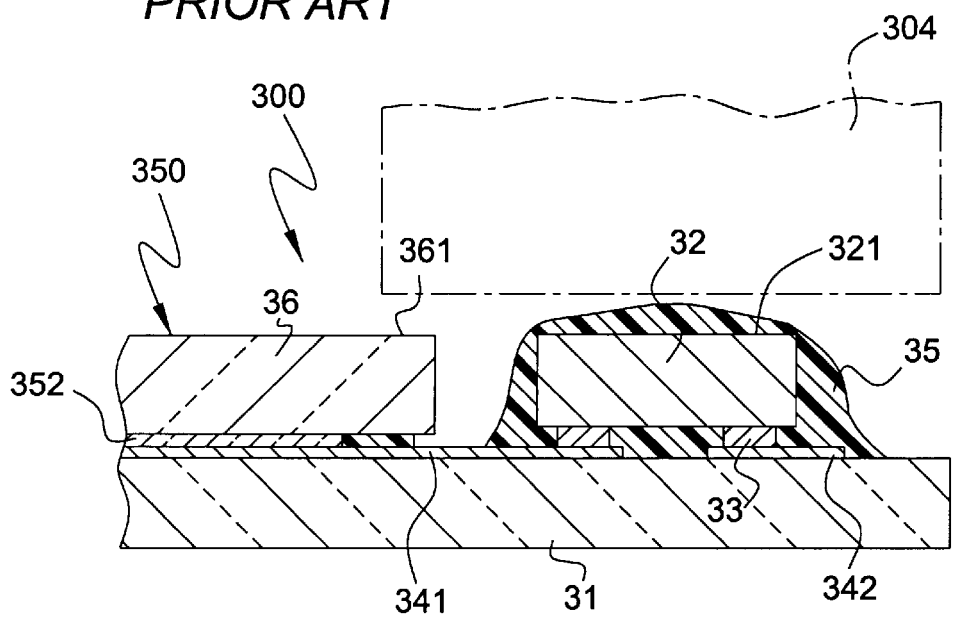
FIG. 14 is a sectional view illustrating a conventional liquid crystal device.

FIG. 13 is a perspective view illustrating an electronic apparatus 22 in accordance with a ninth preferred embodiment of the present invention.

In this ninth preferred embodiment, an electronic apparatus 22 is provided with the liquid crystal device 100 of the present invention as a display device. In this ninth preferred embodiment, the electronic apparatus 22 is a portable telephone which is required to be made small, lightweight and thin from the viewpoint of its functions, and is required to have a large display screen in order to make the displayed information easy to see. The liquid crystal device 100 of the present invention is compact and has a small area for mounting the driving IC 1, and thus enable an increase in the size of the screen without increase in the side of the liquid crystal device 100. Even in the portable telephone provided with the liquid crystal device 100, the area for mounting the liquid crystal device 100 can be decreased, and thus other electronic parts can efficiently be mounted. It is thus possible to provide a small product having a high degree of freedom in designing the product, a large display screen and a high value as a commercial product.

In accordance with the present invention, even when a driving element is COG-mounted on a substrate of a compact liquid crystal panel having a narrow marginal area in which the distance between the driving element and the first substrate is decreased, the bonding tool for pressing the driving element does not contact the other opposing substrate of the liquid crystal panel. It is thus possible to carry out face-down bonding by using a large bonding tool. Consequently, the bonding tool can easily be maintained in parallel, and the heat capacity of the bonding tool is increased, thereby permitting facedown bonding with a more uniform load at a more uniform temperature. Thus, the present invention provides a small liquid crystal device with high reliability in which the bonding between the driving element and panel interconnecting lines is sufficiently ensured.

When the liquid crystal device is mounted in an electronic apparatus, the electronic apparatus obtained is small, lightweight and thin and has high reliability.

Accordingly, the present invention has been described with a degree of particularity directed to the preferred embodiments of the present invention. It should be appreciated, though, that the present invention is defined by the following claims construed in light of the prior art so that modifications or changes may be made to the preferred embodiments of the present invention without departing from the inventive concepts contained herein.

What is claimed is:

1. A liquid crystal device, comprising:
   a first substrate having opposite first and second main surfaces;
   a second substrate having opposite third and fourth main surfaces, the third main surface having first and second regions with the first region being disposed opposite to the second main surface of said first substrate;
   a liquid crystal material provided between the second main surface of said first substrate and the first region of said second substrate;
   interconnecting lines provided on the third main surface of said second substrate; and
   a driving element provided on the second region of the third main surface of said second substrate and electrically connected to said interconnecting lines, and having placed adjacent fifth and sixth main surfaces, the sixth main surface placed opposite to the third main surface of said second substrate, and a height of the fifth main surface from said third main surface being greater than a height of the first main surface of said first substrate from the third main surface.

2. A liquid crystal device according to claim 1, wherein the height of the fifth main surface from the third main surface is at least 0.08 millimeters greater than the height of the first main surface of said first substrate from the third main surface.

3. A liquid crystal device according to claim 1, wherein the height of the fifth main surface from the third main surface is at least 1.17 times greater than the height of the first main surface of said first substrate from the third main surface.

4. A liquid crystal device according to claim 1, wherein the height of the fifth main surface from the third main is 4.7 times or less than 4.7 times the height of the first main surface from the third main surface.

5. A liquid crystal device, comprising:
   a first substrate having opposite first and second main surfaces;
   a second substrate having opposite third and fourth main surfaces, the third main surface having first and second regions with the first region being disposed opposite to the second main surface of said first substrate;
   a liquid crystal material provided between the second main surface of said first substrate and the first region of said second substrate;
   interconnecting lines provided on the third main surface of said second substrate; and
   a driving element provided on the second region of the third main surface of said second substrate and electrically connected to said interconnecting lines, and having a thickness greater than a thickness of said first substrate.

6. A liquid crystal device according to claim 5, wherein the thickness of said driving element is at least 0.08 millimeters greater than the thickness of said first substrate.

7. A liquid crystal device according to claim 5, wherein the thickness of said driving element is at least 1.17 times greater than the thickness of said first substrate.

8. A liquid crystal device according to claim 5, wherein the thickness of said driving element is 4.7 times or less than 4.7 times than the thickness of said first substrate.

9. A liquid crystal device according to claim 5, wherein the distance between said first substrate and said driving element is 2 millimeters or less.

10. A liquid crystal device according to claim 5, wherein said driving element is bonded in a face-down relationship to said second substrate.

11. A display device according to claim 5, wherein said driving element is bonded to said interconnecting lines through bumps.

12. A display device according to claim 5, wherein said driving element is fixed to said second substrate with an adhesive material selected from a group consisting of an adhesive, a combination of the adhesive and a conductive paste, or an anisotropic conductive film.

13. A method of manufacturing a liquid crystal device comprising the steps of:
   preparing a liquid crystal panel including:
      a first substrate having opposite first and second main surfaces;
      a second substrate having opposite third and fourth main surfaces, interconnecting lines being provided on the third main surface, the third main surface having first and second regions with the first region being placed opposite to the second main surface of said first substrate; and
      a liquid crystal material provided between the second main surface of said first substrate and the first region of said second substrate; and
   pressing a driving element having opposite fifth and sixth main surfaces with bumps provided on the sixth main surface by a bonding tool from the fifth main surface thereof, to bond the bumps to the interconnecting lines as well as fixing said driving element to said second substrate with a fixing member provided between the sixth main surface of said driving element and the third main surface of said second substrate in the state wherein the sixth main surface of said driving element is placed opposite to the second region of the third main surface of said second substrate so that when the bumps are bonded to the interconnecting lines to mount said driving element on the third main surface, a height of the fifth main surface from said third main surface is greater than a height of the first main surface of said first substrate from the third main surface.

14. A method of manufacturing a liquid crystal device according to claim 13, wherein, when the bumps are bonded to said interconnecting lines to mount said driving element on the third main surface, a height of the fifth main surface from the third main surface is at least 0.08 millimeters greater than the height of the first main surface of said first substrate from the third main surface.

15. A method of manufacturing a liquid crystal device according to claim 13, wherein, when the bumps are bonded to said interconnecting lines to mount said driving element on the third main surface, the height of the fifth main surface from the third main surface is at least 1.17 times greater than the height of the first main surface of said first substrate from the third main surface.

16. A method of manufacturing a liquid crystal device according to claim 13, wherein, when the bumps are bonded to said interconnecting lines to mount said driving element on the third main surface, the height of the fifth main surface from the third main surface is 4.7 times or less than 4.7 times the height of the first main surface from the third main surface.

17. A liquid crystal device manufactured by a method according to claim 13.

18. A method of manufacturing a liquid crystal device, comprising the steps of:
   preparing a liquid crystal panel including:
      a first substrate having opposite first and second main surfaces;
      a second substrate having opposite third and fourth main surfaces and interconnecting lines being provided on the third main surface, the third main surface having first and second regions with the first region being disposed opposite to the second main surface of said first substrate; and
      a liquid crystal material provided between the second main surface of said first substrate and the first region of said second substrate; and
   pressing a driving element having opposite fifth and sixth main surfaces and bumps provided on the sixth main surface by a bonding tool from the fifth main surface thereof, to bond the bumps to the interconnecting lines as well as fixing said driving element to said second substrate with a fixing member provided between the sixth main surface of said driving element and the third main surface of said second substrate in a state wherein the sixth main surface of said driving element is disposed adjacent to the second region of the third main surface of said second substrate so that a thickness of said driving element is greater than a thickness of said first substrate.

19. A method of manufacturing a liquid crystal device according to claim 18, wherein the thickness of said driving element is at least 0.08 millimeters greater than the thickness of said first substrate.

20. A method of manufacturing a liquid crystal device according to claim 18, wherein the thickness of said driving element is at least 1.17 times greater than the thickness of said first substrate.

21. A method of manufacturing a liquid crystal device according to claim 18, wherein the thickness of said driving element is 4.7 times or less than 4.7 times than the thickness of said first substrate.

22. A method of manufacturing a liquid crystal device according to claim 18, wherein said driving element is fixed to said second substrate by a fixing member with a distance of 2 millimeters or less between said first substrate and said driving element.

23. A method of manufacturing a liquid crystal device according to claim 18, wherein said fixing member is an adhesive.

24. A method of manufacturing a liquid crystal device according to claim 23, further comprising the steps of adhering a conductive paste to the bumps to bond the bumps to the interconnecting lines through the conductive paste and fixing said driving element to said second substrate with the adhesive.

25. A method of manufacturing a liquid crystal device according to claim 23, wherein the adhesive is a thermosetting adhesive so that said driving element is heated while being pressed by the bonding tool to fix said driving element to said second substrate with the adhesive.

26. A method of manufacturing a liquid crystal device according to claim 23, wherein the adhesive is a thermosetting adhesive so that the adhesive is heated by applying light to the adhesive while pressing said driving element by the bonding tool to fix said driving element to said second substrate with the adhesive.

27. A method of manufacturing a liquid crystal device according to claim 23, wherein the adhesive is a photosetting adhesive so that the adhesive is cured by applying light to the adhesive while pressing said driving element by the bonding tool to fix said driving element to said second substrate with the adhesive.

28. A method of manufacturing a liquid crystal device according to claim 18, wherein the fixing member is an anisotropic conductive film comprising an adhesive and conductive particles.

29. An electronic apparatus, comprising:

a liquid crystal device including a first substrate having opposite first and second main surfaces;

a second substrate having opposite third and fourth main surfaces, the third main surface having first and second regions with the first region being disposed opposite to the second main surface of said first substrate;

a liquid crystal material provided between the second main surface of said first substrate and the first region of said second substrate;

interconnecting lines provided on the third main surface of said second substrate; and a driving element provided on the second region of the third main surface of said second substrate and electrically connected to said interconnecting lines, and having opposite fifth and sixth main surfaces, the sixth main surface placed adjacent to the third main surface of said second substrate, and a height of the fifth main surface from said third main surface being greater than a height of the first main surface of said first substrate from the third main surface.

* * * * *